(12) United States Patent
Eilert et al.

(10) Patent No.: US 7,328,301 B2
(45) Date of Patent: Feb. 5, 2008

(54) DYNAMICALLY MAPPING BLOCK-ALTERABLE MEMORIES

(75) Inventors: Sean S. Eilert, Penryn, CA (US); Alec W. Smidt, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 463 days.

(21) Appl. No.: 10/408,131

(22) Filed: Apr. 7, 2003

(65) Prior Publication Data

US 2004/0196723 A1  Oct. 7, 2004

(51) Int. Cl.
*G06F 12/00* (2006.01)
*G06F 13/00* (2006.01)
*G06F 9/455* (2006.01)
*G11C 11/34* (2006.01)

(52) U.S. Cl. ............. 711/103; 711/102; 711/2; 365/185.11; 365/185.17; 365/200; 703/28

(58) Field of Classification Search ......... 711/103, 711/2, 102; 365/185.11, 185.17, 200; 340/572.1; 703/28
See application file for complete search history.

(56) References Cited

U.S. PATENT DOCUMENTS

| | | | | |
|---|---|---|---|---|
| 5,581,723 A | | 12/1996 | Hasbun et al. ............. 395/430 |
| 5,956,742 A | | 9/1999 | Fandrich et al. ............ 711/103 |
| 6,000,005 A | * | 12/1999 | Yamada ..................... 711/103 |
| 6,324,087 B1 | * | 11/2001 | Pereira ......................... 365/49 |
| 6,356,197 B1 | * | 3/2002 | Patterson et al. ......... 340/572.1 |
| 6,360,293 B1 | * | 3/2002 | Unno ......................... 711/103 |
| 6,493,807 B1 | | 12/2002 | Martwick ................... 711/163 |
| 6,542,391 B2 | * | 4/2003 | Pereira et al. ............... 365/49 |
| 6,711,041 B2 | * | 3/2004 | Pereira et al. ............... 365/49 |
| 6,865,122 B2 | | 3/2005 | Srinivasan ................ 365/200 |
| 6,904,400 B1 | * | 6/2005 | Peri et al. ..................... 703/28 |
| 6,973,531 B1 | * | 12/2005 | Chang et al. .............. 711/103 |
| 6,985,992 B1 | * | 1/2006 | Chang et al. .............. 711/103 |
| 7,035,967 B2 | * | 4/2006 | Chang et al. .............. 711/103 |
| 7,080,232 B2 | * | 7/2006 | Aasheim et al. ............ 711/205 |
| 7,155,559 B1 | * | 12/2006 | Estakhri et al. ............ 711/103 |
| 2001/0054129 A1 | * | 12/2001 | Wouters .................... 711/103 |
| 2003/0137873 A1 | * | 7/2003 | Kawamura ............. 365/185.11 |
| 2004/0049627 A1 | * | 3/2004 | Piau et al. .................. 711/103 |
| 2004/0149896 A1 | * | 8/2004 | Seethaler ................ 250/223 B |

OTHER PUBLICATIONS

"What is Flash Memory?". Intel Article, Oct. 2002, http://www.intel.com.
"Intel Flash Data Integrator User's Guide Version 5"; July 2002, pp. 11-16 and 103-128. http://www.intel.com.

* cited by examiner

*Primary Examiner*—Hyung Sough
*Assistant Examiner*—Mardochee Chery
(74) *Attorney, Agent, or Firm*—Trop, Pruner & Hu, P.C.

(57) ABSTRACT

In one embodiment, the present invention includes a method for reassigning a first address of a block-alterable memory to a second address of the block-alterable memory, where the second address corresponds to an updated available block. In such manner block-alterable memories may be dynamically mapped.

4 Claims, 3 Drawing Sheets

DYNAMICALLY MAPPING BLOCK-ALTERABLE MEMORIES

BACKGROUND

Block-alterable memories, such as flash memories, are often used for applications in which non-volatility and programmability are desired. Typically such memory devices include a number of separately erasable blocks. To update a particular block, it is first erased and data is then written to the erased block. Different block-alterable memories exist, such as NOR and NAND flash designs, both of which use absolute physical addressing to address blocks within user memory space. In addition, such devices may be read while write memories or may not support read while write operations. In read while write implementations, bits in one set of blocks (a partition), are readable while bits in another partition are being manipulated and vice versa.

Users desire that block-alterable memories accurately store and retrieve data and operate quickly. While data may be read from flash memories rapidly, erasing flash memory takes much longer. Erase times for conventional flash memories are on the order of hundreds of milliseconds for NOR flash memories and on the order of milliseconds for NAND flash memories. While software techniques are often implemented to accommodate long erase times, these techniques involve complex software and are not always capable of hiding the impact of relatively long erase times from a user.

Thus a need exists for maximizing user perceived reliability and minimizing user perceived erase times of block-alterable memories.

DETAILED DESCRIPTION

Figure 1:
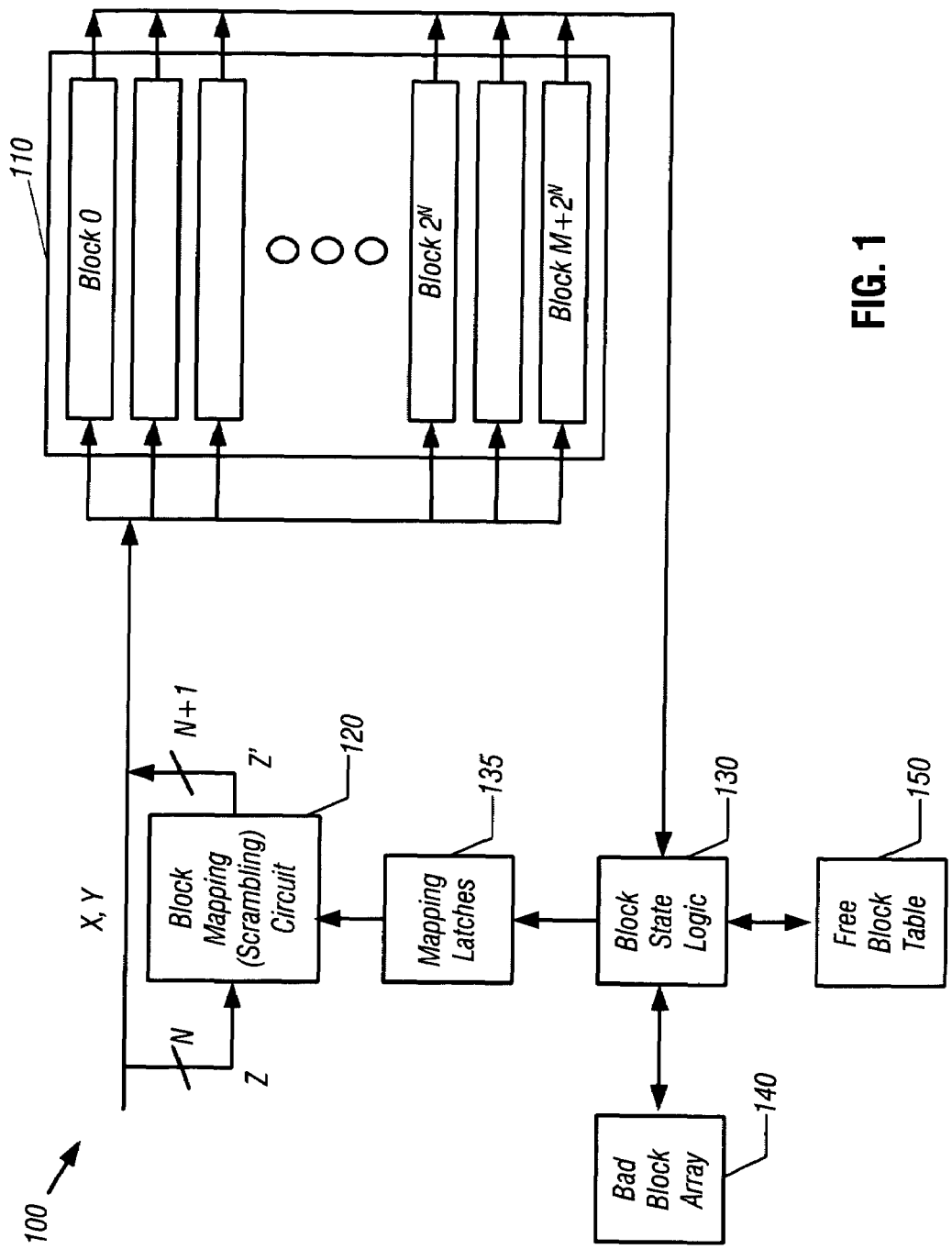
FIG. 1 is a block diagram of a block-alterable memory in accordance with one embodiment of the present invention.

Referring now to FIG. 1, shown is a block diagram of a block-alterable memory in accordance with one embodiment of the present invention. As shown in FIG. 1, block-alterable memory 100, which may be a flash memory device, may include memory array 110 which includes a plurality of individual blocks. A block is a memory element that includes a number of rows and columns of memory cells. While the number of blocks in memory array 110 may vary, in certain embodiments featuring multi-level cells, 64 blocks may be present with each block of memory having 1 Megabytes (MB) of data storage, each of which may be separately erasable.

As further shown in FIG. 1, memory 100 receives logical addressing information from a host system to which it is coupled. In certain embodiments, a host system may be, for example, a cellular telephone, personal digital assistant (PDA), laptop computer, or the like. As shown in FIG. 1, this logical address includes X address bits (i.e., row address bits), Y address bits (i.e., column address bits) and Z address bits (block address bits). In the embodiment of FIG. 1, a block mapping circuit 120 may be coupled to memory array 110. Block mapping circuit 120 receives at least a portion of the logical address information from the host system and provides a physical address output to memory array 110. More specifically in the embodiment shown in FIG. 1, block mapping circuit 120 receives the Z address from the host system and in turn provides a physical address (Z') to memory array 110. This Z address may be a portion of the user logical address which indicates which block of the data array 110 is to be addressed. Shown also in FIG. 1, host system provides the X and Y portions of the user address directly to memory array 110. While the embodiment of FIG. 1 shows a user address which includes X, Y, and Z address bits, in other embodiments other manners of addressing the memory device may be implemented.

In the embodiment of FIG. 1, coupled to block mapping circuit 120 may be mapping latches 135. In one embodiment, mapping latches 135 may be static random access memory (SRAM). These latches 135 may be used to store translation information regarding transformation of logical addresses to physical addresses already assigned (i.e., the relationship between Z and Z' addresses). Block state logic 130 may be coupled between memory array 110 and mapping latches 135. In various embodiments, block state logic 130 may use inputs thereto to determine block state and provide an indication of the same to mapping latches 135. In one embodiment, data may be provided from memory array 110 to block state logic 130 on power up.

As shown in FIG. 1, also coupled to block state logic 130 may be a bad block array 140. In one embodiment, bad block array 140 may be an array of non-volatile memory cells used to store the good/bad state of each physical block of memory array 110.

As further shown in FIG. 1, in certain embodiments, a free block table 150, which in one embodiment may be a collection of volatile memory elements initiated on power up and maintained through normal device operation, may contain a list of blocks available for assignment to user address space. In one embodiment free block table 150 may be coupled to block state logic 130 to provide a list of available blocks thereto. Also, block state logic 130 may provide information regarding blocks placed in use back to free block table 150.

While not shown in FIG. 1, in various embodiments a write/erase control engine may be used to perform automated program and erase operations, such as to sequence high voltage signals needed for erase operations. Similarly, other peripheral circuits also may be present in memory 100.

During operation of one embodiment, based on the Z address provided to block mapping circuit 120 and data in mapping latches 135, block mapping circuit 120 may generate a Z' address. Each external user address may be dynamically re-mapped to an internal block address for all physical blocks within memory 100. By dynamic, it is meant that logical to physical address mapping may be changed on the fly; as a new block is placed into service during operation, it is provided with a physical address that may be changed if the block is later erased and placed back into service. In one embodiment, block mapping circuit 120 may scramble incoming address bits based on data stored in non-volatile memory cells, for example content addressable memory (CAM) or a small mini-array that is loaded to latches 135 on power up. Thus as shown in FIG. 1, block mapping circuit 120 may also be referred to as a block scrambling circuit. In so doing, block mapping circuit 120 may thus virtualize a physical block address provided by a host system to a virtual block address.

In one embodiment, each block of memory array 110 may provide the following associated bits as inputs to block mapping circuit 120: (1) BAD; (2) VALID; (3) DIRTY; and (4) ADDRESS. In such an embodiment, the BAD bit may designate a block as being defective. As such, the bad block is effectively removed from the pool of available blocks. This bit may be programmed during manufacturing flow or, in the case of on-the-fly block repair, during an erase algorithm. In certain embodiments, this bit may never be erased. The VALID bit may indicate that the associated block contains valid data. In one embodiment, this bit may be programmed when the first word is programmed in an unused block. Also, the block address may be programmed in parallel with this bit in certain embodiments. This bit may be erased during a cleanup cycle, in one embodiment. The DIRTY bit may designate the block as a block needing erase. In various embodiments, this bit may be programmed upon receipt on an incoming customer erase command for the block identified in the ADDRESS bits. Finally, the ADDRESS bits may identify which portion of the user address space that the associated block occupies.

Of course, in other embodiments more, fewer or different associated bits may be provided to block mapping circuit 120. In certain embodiments, all of the status bits for a given block may be stored in a status register within that block. On powerup, the bits may be provided to block state logic 130.

Figure 2:
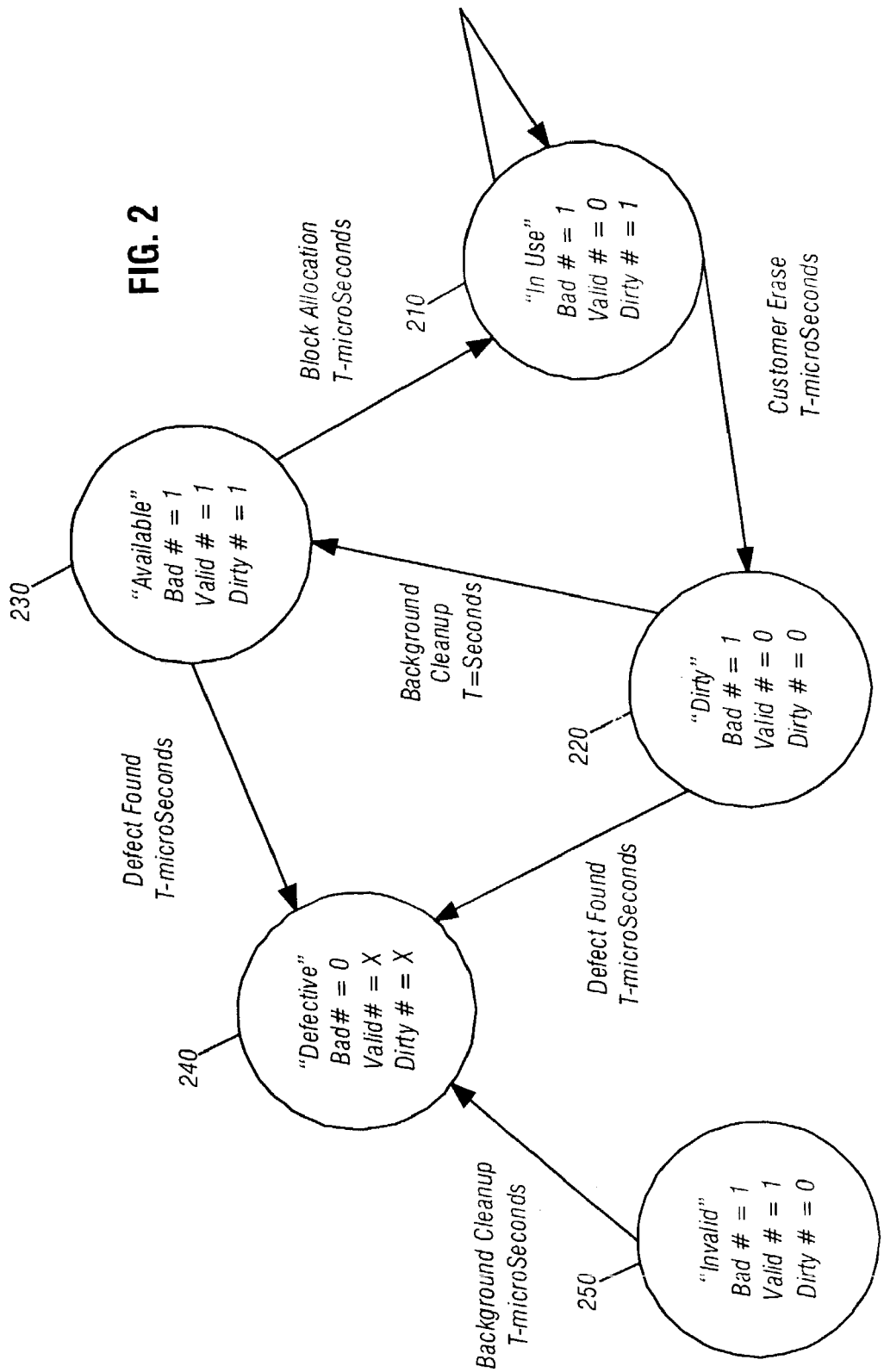
FIG. 2 is a state diagram of memory operations in accordance with one embodiment of the present invention.

Referring now to FIG. 2, shown is a state diagram in accordance with one embodiment of the present invention. As shown in FIG. 2, an "In Use" state of a block (circle 210) may mean that a block contains valid data. In such an "In Use" state, the bad bit may be set to one, the valid bit set to zero and the dirty bit set to one. In certain embodiments, programming of such a block may take on the order of microseconds. As shown in FIG. 2, a customer erase command may cause an "In Use" block to be changed to a "Dirty" block (circle 220). As shown in FIG. 2, such a "Dirty" state may be indicated with a bad bit set to one, a valid bit set to zero and a dirty bit set to zero. In certain embodiments, a customer erase operation may also take on the order of microseconds. From a "Dirty" state, in certain embodiments a block may be background cleaned or alternately a defect may be found in the block.

For a situation in which the block is background cleaned, such operation may take on the order of seconds, and may cause the block to become available (circle 230). In such an available state, the block may have a bad bit set to one, a valid bit set to one and a dirty bit set to one. In a "Defective" state (circle 240) a bad bit may be set to zero and valid and dirty bits may be don't care states. In an "Invalid" state (circle 250) a bad bit may be set to one, a valid bit set to one and a dirty bit set to zero.

The following TABLE 1 associates the various states of the state diagram of FIG. 2 in a state table format.

TABLE 1

| Bad # | Valid # | Dirty # | Address | Block State Definition |
|---|---|---|---|---|
| 0 | X | X | X | Defective |
| 1 | 1 | 1 | X | Available-Initial State |
| 1 | 1 | 0 | X | Invalid |
| 1 | 0 | 1 | User-space mapping | In Use-Contains Valid Data |
| 1 | 0 | 0 | X | Dirty-Erase Required |

It is to be understood that the states set forth in TABLE 1 and discussed above with regard to FIG. 2 represent only one implementation. In other embodiments, implementation may vary to address power loss recovery or other issues.

In certain embodiments, background cleanup operations may be optimized using multi-block erase techniques, as are well known in the art. In certain instances, it may be possible for all blocks to pile up in either the "Dirty" or "In Use" state. In such cases, a user may perceive a program time on the order of seconds. In such circumstances block allocation may be implemented independently from program commands so that user software may handle such programming independently from normal programming functions.

In certain embodiments, a load leveling (i.e., wear leveling) algorithm may be integrated into a block assignment algorithm within block mapping circuit 120. In certain embodiments, reads from any block to which no physical block has been assigned may return ERASED data.

As discussed in one embodiment a "bad" bit may be programmed once for a bad block and never be erased over the lifetime of the device. In certain embodiments bad bits may be implemented as content addressable memory (CAM) cells that are automatically latched and powered down on device power up. Alternately, such bits may be implemented as a mini-array that is read and latched on power up.

In certain embodiments, dirty, valid and address bits may be implemented in bits within the erase block itself. In certain embodiments, these bits may be read out to periphery latches on power up, since they may be used by periphery logic to perform redundancy match operations. In certain embodiments, data may be mirrored between latches and the array over device operation. In certain embodiments, addition of an additional status bit for power loss recovery (PLR) may be added by indicating that the block has been successfully erased.

In certain embodiments of the present invention, read while write memories may be used. In such embodiments, the available block pool may be subdivided such that separate pools may be maintained for each partition. Alternately, each block may be designed to be independent of other blocks such that it could be assigned to any partition without concern for conflict during read while write operations. During read while write implementations or non-read while write implementations, it may be desirable to make a reclaim operation (i.e., background cleanup) user controllable. In such an embodiment, the user may have the flexibility of managing the reclaim operation, avoiding long suspend latencies.

In certain embodiments, the present invention may pre-enable use of background operations on block alterable memory devices, thus enabling background refresh in advanced data management operations. In certain embodiments, the additional layer of abstraction provided by dynamically manipulating a user supplied block address into a physical address may provide improved erase performance and enhanced reliability features.

Embodiments of the present invention may be implemented in code and may be stored on a storage medium having stored thereon instructions which can be used to program a system, such as a wireless device to perform the instructions. The storage medium may include, but is not limited to, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs), erasable programmable read-only memories (EPROMs), flash memories, electrically erasable programmable read-only memories (EEPROMs), magnetic or optical cards, or any type of media suitable for storing electronic instructions.

Figure 3:
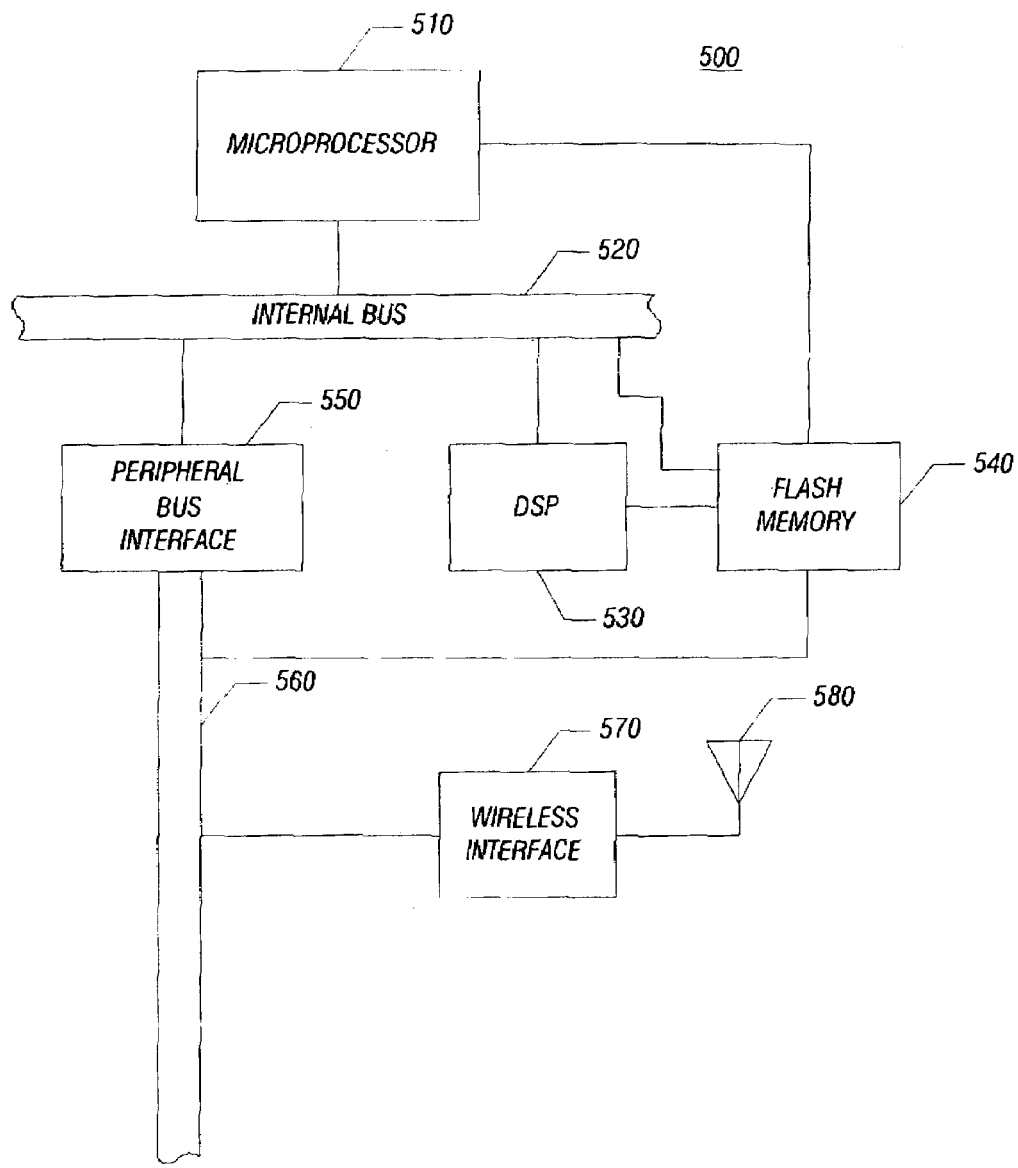
FIG. 3 is a block diagram of a wireless device with which embodiments of the present invention may be used.

FIG. 3 is a block diagram of a wireless device with which embodiments of the invention may be used. As shown in FIG. 3, in one embodiment wireless device 500 includes a processor 510, which may include a general-purpose or special-purpose processor such as a microprocessor, microcontroller, application specific integrated circuit (ASIC), a programmable gate array (PGA), and the like. Processor 510 may be coupled to a digital signal processor (DSP) 530 via an internal bus 520. In turn, DSP 530 may be coupled to a flash memory 540 which may execute dynamic remapping in accordance with an embodiment of the present invention, and may also include the memory array to be dynamically remapped. As further shown in FIG. 3, flash memory 540 may also be coupled to microprocessor 510, internal bus 520, and peripheral bus 560.

As shown in FIG. 3, microprocessor device 510 may also be coupled to a peripheral bus interface 550 and a peripheral bus 560. While many devices may be coupled to peripheral bus 560, shown in FIG. 3 is a wireless interface 570 which is in turn coupled to an antenna 580. In various embodiments antenna 580 may be a dipole antenna, helical antenna, global system for mobile communication (GSM) or another such antenna.

Although the description makes reference to specific components of device 500, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   mapping a first logical block address to a first physical block address in a block-alterable memory;
   receiving a non-automated request from a user to erase a first block located at the first physical block address;
   mapping the first logical block address to a second physical block address, the second physical block address assigned an available state;
   writing data to a second block located at the second physical block address in response to receiving the non-automated request;
   assigning a dirty state to the first physical block address; and
   delaying erasure of the first block to occur during a background cleanup.

2. The method of claim 1, further comprising mapping the first logical block address to the second physical block address based on data stored in a non-volatile memory cell.

3. The method of claim 1, further comprising wear leveling the block-alterable memory.

4. The method of claim 1, wherein the block-alterable memory comprises a flash memory.

* * * * *